United States Patent
Astrachan et al.

(10) Patent No.: US 10,476,455 B1
(45) Date of Patent: Nov. 12, 2019

(54) APPARATUS AND METHOD OF SUPPRESSING TRANSIENT NOISE DURING TRANSITION FOR CLASS-D AMPLIFIER SYSTEM HAVING ONE OR MORE PULSE WIDTH MODULATOR OUTPUT PATHS

(71) Applicant: CIRRUS LOGIC INTERNATIONAL SEMICONDUCTOR LTD., Edinburgh (GB)

(72) Inventors: Paul Astrachan, Austin, TX (US); Emmanuel Marchais, Drippings Springs, TX (US); Lingli Zhang, Austin, TX (US); Zhaohui He, Austin, TX (US); Kyehyung Lee, Austin, TX (US); Tejasvi Das, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/057,820

(22) Filed: Aug. 8, 2018

(51) Int. Cl.
*H03F 3/38* (2006.01)
*H03F 3/217* (2006.01)
*H03M 5/08* (2006.01)
*H03K 7/08* (2006.01)

(52) U.S. Cl.
CPC ............... *H03F 3/217* (2013.01); *H03K 7/08* (2013.01); *H03M 5/08* (2013.01); *H03F 2200/342* (2013.01)

(58) Field of Classification Search
CPC ........................................ H03F 3/38

USPC .......................... 330/10, 207 A, 251
See application file for complete search history.

(56) References Cited

U.S. PATENT DOCUMENTS

| | | | |
|---|---|---|---|
| 8,081,022 B2* | 12/2011 | Berkhout | H03F 3/217 327/108 |
| 9,071,267 B1 | 6/2015 | Schneider et al. | |
| 9,071,268 B1 | 6/2015 | Schneider et al. | |
| 9,148,164 B1 | 9/2015 | Schneider et al. | |
| 9,525,940 B1 | 12/2016 | Schneider et al. | |
| 9,787,261 B2* | 10/2017 | Lesso | H03F 1/0211 |
| 9,880,802 B2 | 1/2018 | Satoskar et al. | |
| 10,224,877 B2* | 3/2019 | Zhu | H03F 1/0233 |
| 2015/0015426 A1* | 1/2015 | Lindahl | H04L 25/4902 341/53 |

* cited by examiner

*Primary Examiner* — Henry Choe
(74) *Attorney, Agent, or Firm* — Huffman Law Group, PC

(57) ABSTRACT

A class-D amplifier system includes one or more pulse width modulation (PWM) output paths at least one of which includes one or more digital closed-loop PWM modulators (DCL-PWMM) in which at least one of the DCL_PWMM includes a digital integrator that provides an output value and receives a feedback value. The output value has an output resolution and the feedback value has a feedback resolution that is coarser than the output resolution. The output value is the sum of an integer multiple of the feedback resolution and a residue. Control logic decreases/increases the residue of the digital integrator toward an integer multiple of the feedback resolution over a plurality of clock cycles in response to a request to transition the class-D amplifier and forces an output of the DCL_PWMM to have an approximate 50% duty cycle after decreasing/increasing the residue over the plurality of clock cycles.

24 Claims, 9 Drawing Sheets

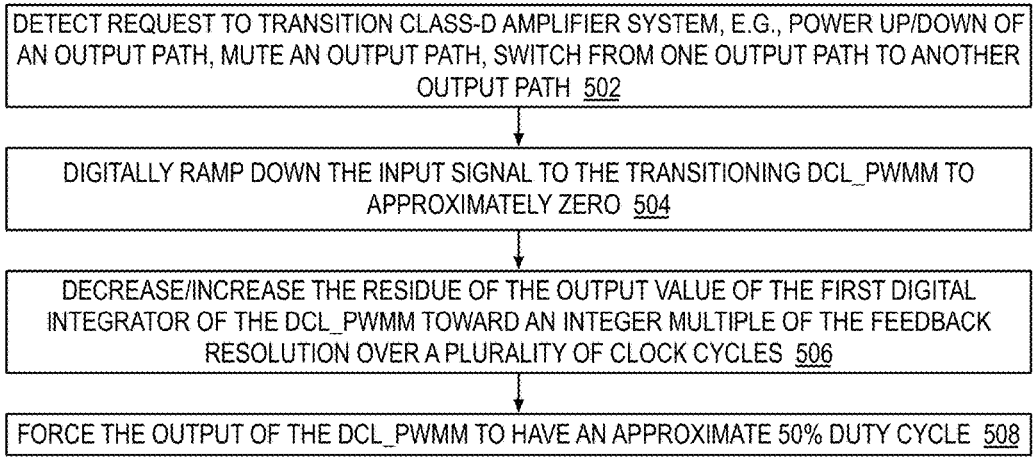
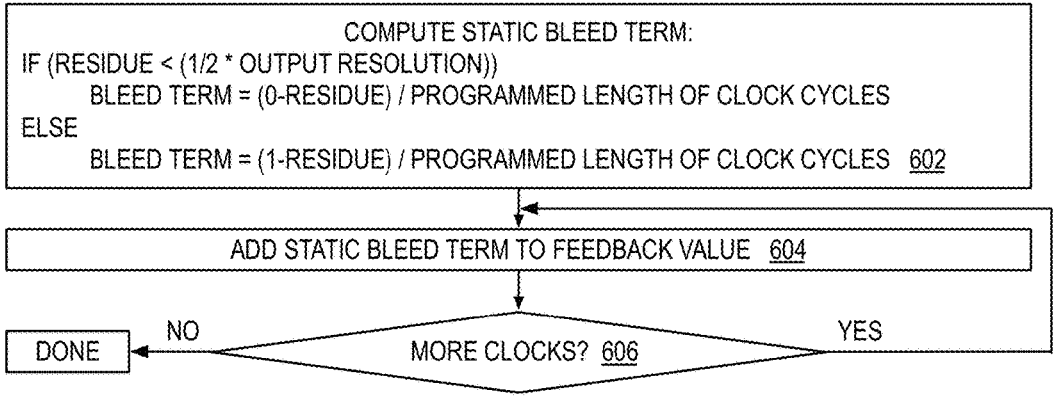
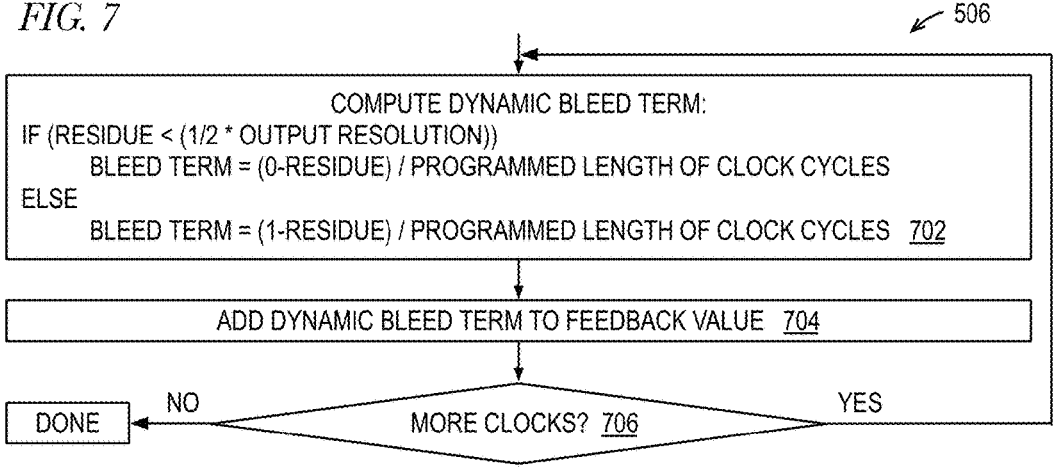

APPARATUS AND METHOD OF SUPPRESSING TRANSIENT NOISE DURING TRANSITION FOR CLASS-D AMPLIFIER SYSTEM HAVING ONE OR MORE PULSE WIDTH MODULATOR OUTPUT PATHS

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers. Typically, a pulse-width modulation (PWM) amplifier is chosen in order to provide accurate load voltage with desirable Total Harmonic Distortion (THD) and Power Supply Rejection Ratio (PSRR).

A digital closed-loop PWM modulator (DCL_PWMM) may include a digital signal modulator whose output is received by a PWM encoder. Because the output of the digital signal modulator is quantized, quantization noise can cause significant pops in the output when a transition occurs, e.g., the system is muted or powered down. It may be desirable to reduce or eliminate such audio artifacts.

SUMMARY

In one embodiment, the present disclosure provides a class-D amplifier system that includes one or more pulse width modulation (PWM) output paths at least one of which comprises one or more digital closed-loop PWM modulators (DCL-PWMM) in which at least one of the DCL_PWMM includes a digital integrator that provides an output value and receives a feedback value. The output value has an output resolution and the feedback value has a feedback resolution. The output resolution is finer than the feedback resolution. The output value is the sum of an integer multiple of the feedback resolution and a residue. Control logic is configured to decrease/increase the residue of the digital integrator toward an integer multiple of the feedback resolution over a plurality of clock cycles in response to a request to transition the class-D amplifier. The control logic forces an output of the DCL_PWMM to have an approximate 50% duty cycle after decreasing/increasing the residue over the plurality of clock cycles.

In another embodiment, the present disclosure provides a method of suppressing transient noise during transition of a class-D amplifier system having one or more pulse width modulation (PWM) output paths at least one of which includes one or more digital closed-loop PWM modulators (DCL-PWMM), wherein at least one of the DCL_PWMM includes a digital integrator that provides an output value and receives a feedback value, the output value having an output resolution and the feedback value having a feedback resolution, the output resolution being finer than the feedback resolution, wherein the output value is the sum of an integer multiple of the feedback resolution and a residue. The method includes, for at least one of the one or more DCL-PWMM, decreasing/increasing the residue of the digital integrator toward an integer multiple of the feedback resolution over a plurality of clock cycles in response to a request to transition the class-D amplifier, and forcing an output of the DCL_PWMM to have an approximate 50% duty cycle after decreasing/increasing the residue over the plurality of clock cycles.

BRIEF DESCRIPTION OF THE DRAWINGS

FIGS. 5 through 8 are flow diagrams illustrating operation of the DCL_PWMM of FIG. 4.

DETAILED DESCRIPTION

Figure 1:
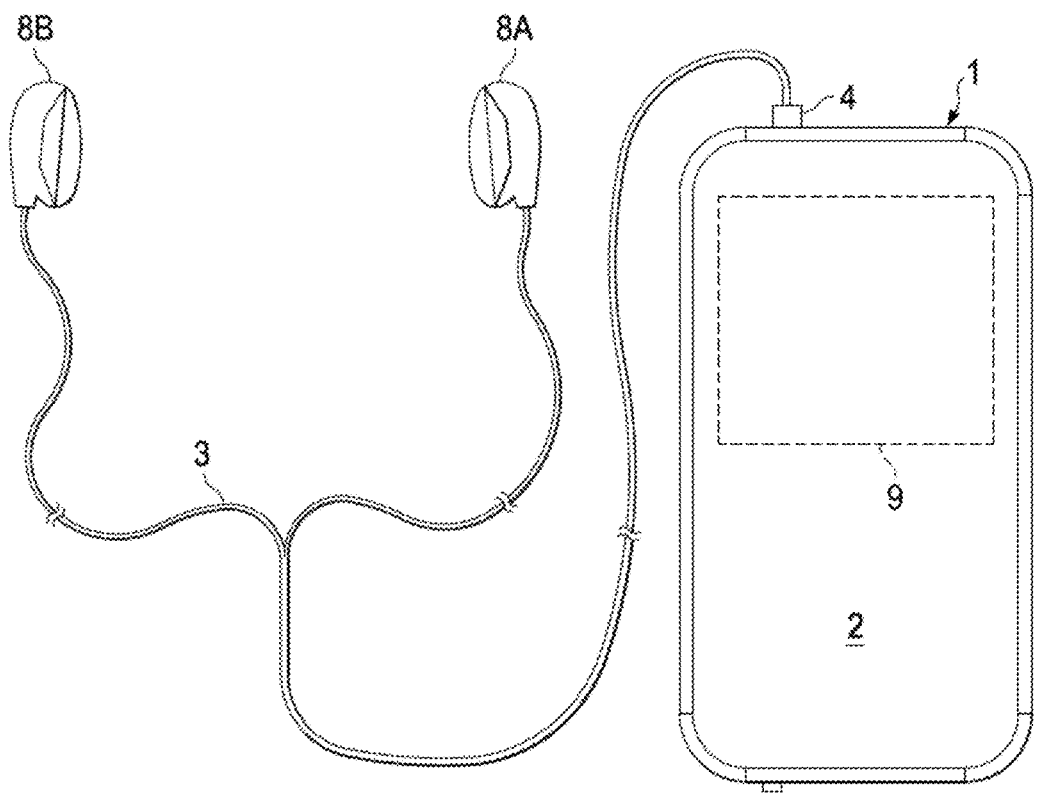
FIG. 1 is an illustration of an example personal audio device.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
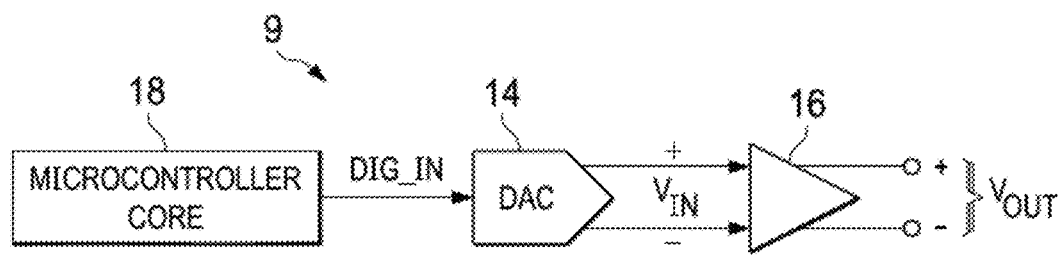
FIG. 2 is a block diagram of selected components of an example audio IC of a personal audio device.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
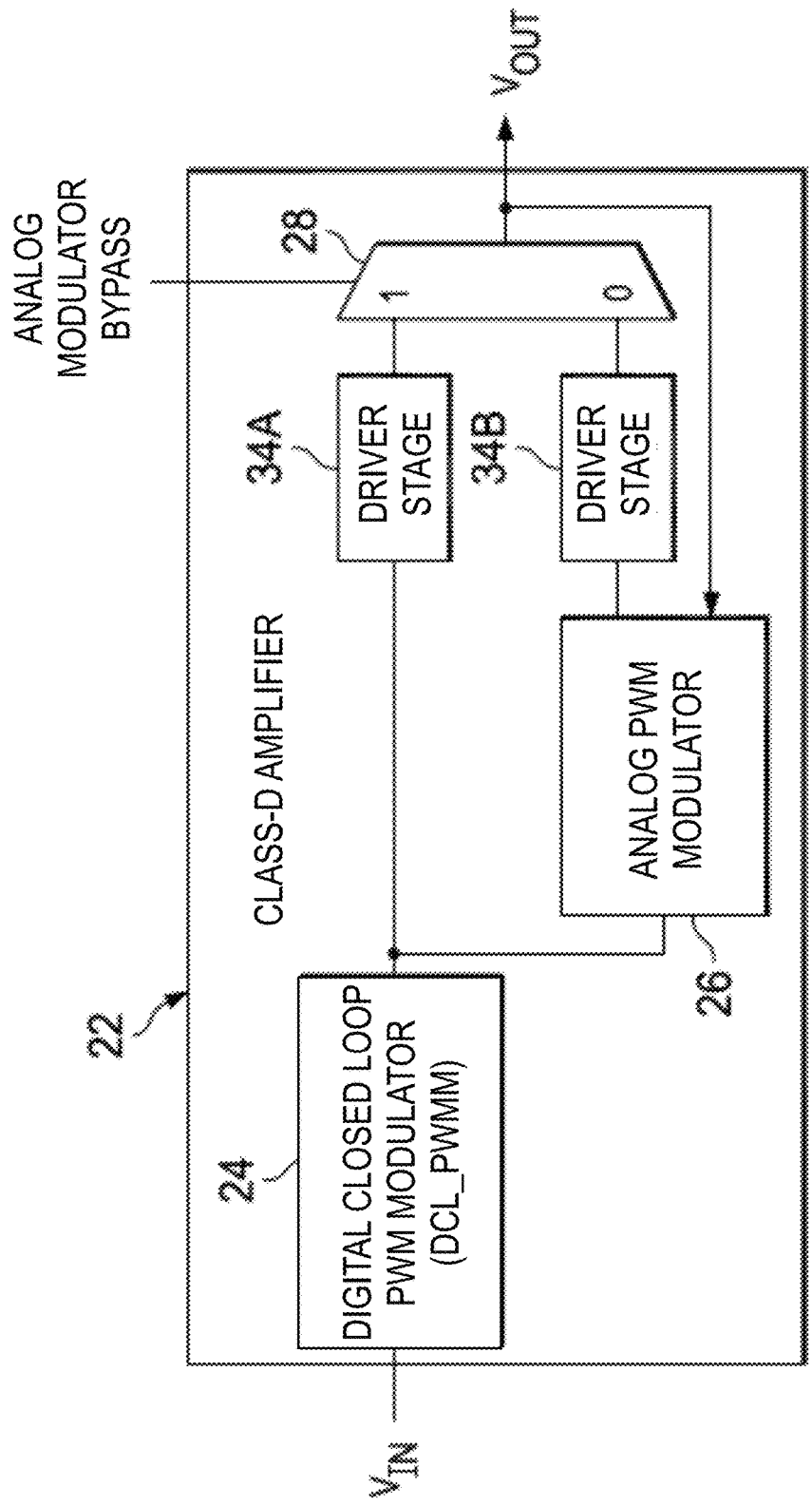
FIG. 3 is a block diagram of selected components of an example class-D amplifier.

FIG. 3 is a block diagram of selected components of an example class-D amplifier 22, in accordance with embodiments of the present disclosure. Preferably, class-D amplifier 22 is a pulse width modulation amplifier. In some embodiments, example class-D amplifier 22 may be used to implement amplifier 16 of FIG. 2. As shown in FIG. 3, example class-D amplifier 22 may include a digital PWM modulator subsystem 24 and an analog PWM modulator 26, along with a direct bypass function implemented with a multiplexer 28. Preferably, the digital PWM modulator subsystem 24 is a digital closed-loop PWM modulator (DCL_PWMM).

The class-D amplifier 22 may be configured to operate in an analog closed-loop mode through the use of analog PWM modulator 26 when the ANALOG MODULATOR BYPASS control signal received by multiplexer 28 is de-asserted. In the analog closed-loop mode, input signal $V_{IN}$ may be modulated by DCL_PWMM 24, analog PWM modulator 26 may receive its input from DCL_PWMM 24, and analog PWM modulator 26 may be utilized such that the output of analog PWM modulator 26, as received and driven by driver stage 34B, is driven as output signal $V_{OUT}$. Driver stage 34B may comprise a plurality of output switches configured to generate output signal $V_{OUT}$ from a modulated signal generated by analog PWM modulator 26.

The class-D amplifier 22 may also be configured to operate in a digital open-loop mode through the use of DCL_PWMM 24 when the ANALOG MODULATOR BYPASS control signal received by multiplexer 28 is asserted. In the digital open-loop mode, analog PWM modulator 26 and a driver stage 34B driven by analog PWM modulator 26 may be bypassed by multiplexer 28, and DCL_PWMM 24 may be utilized such that input signal $V_{IN}$ is modulated by DCL_PWMM 24 and the output of DCL_PWMM 24, as received and driven by an open-loop driver stage 34A, is driven as output signal $V_{OUT}$. Driver stage 34A may comprise a plurality of output switches configured to generate output signal $V_{OUT}$ from a modulated signal generated by DCL_PWMM 24.

Changing class-D amplifier 22 from the analog closed-loop mode and the digital open-loop mode (and vice versa) may be achieved by, through use of multiplexer 28, selecting which of driver stage 34A and driver stage 34B is to drive output signal $V_{OUT}$. In some embodiments, a control circuit (not shown) may be used to control multiplexer 28 in order to select a signal processing path, or output path, for class-D amplifier 22. For example, selection of such multiplexer control signal may be based on one or more characteristics of input signal $V_{IN}$ to the amplifier (e.g., magnitude, frequency, or other characteristic of input signal $V_{IN}$). As described in greater detail below with respect to FIGS. 10-12, class-D amplifier 22 may include a calibration subsystem configured to calibrate at least one of a first gain of a first output path (e.g., open-loop path of DCL_PWMM 24 and driver stage 34A) and a second gain of a second output path (e.g., closed-loop path of analog PWM modulator 26) in order that the first gain and the second gain are approximately equal at the time of switching selection between the first output path and the second output path or vice versa, in order to minimize perceptible audio artifacts due to the switching.

However, FIGS. 4-9 will be now be described which illustrate embodiments of an apparatus and method for use in a class-D amplifier system having a DCL_PWMM to suppress transient noise (e.g., quantization noise) that may cause pops or clicks during a transition such as muting or powering up/down one of the output paths or switching between output paths of the amplifier.

Figure 4:
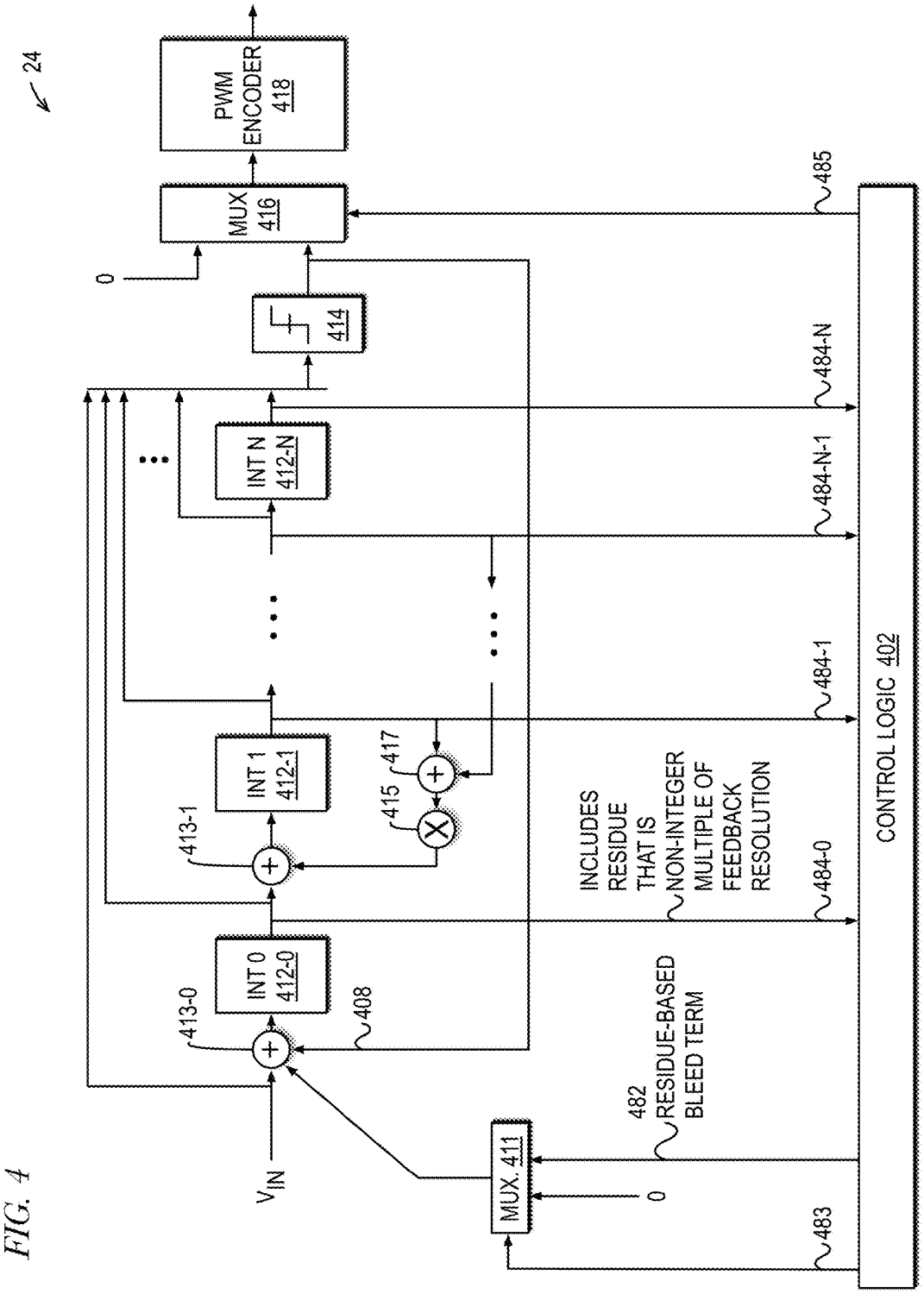
FIG. 4 is a block diagram of an example DCL_PWMM.

FIG. 4 is a block diagram of an example DCL_PWMM 24, in accordance with embodiments of the present disclosure. In some embodiments, DCL_PWMM 24 may be used to implement DCL_PWMM 24 of FIG. 3. The DCL_PWMM 24 includes control logic 402, a mux 411, a sequence of digital integrators 412-0, 412-1 through 412-N (referred to generically as integrator 412-x and collectively as integrators 412), a quantizer 414, a second mux 416, and a PWM encoder 418. The control logic 402 may be implemented by any of various ways to perform the functions described herein. For example, the control logic 402 may be hardware comprising combinatorial logic, sequential logic, or a combination thereof; additionally, the control logic 402 may comprise programmable hardware logic, such as a digital signal processor, CPU, microcontroller, or other programmable hardware logic. The integrators 412 are configured as a sequence in that the output 484-x of an integrator 412-x is provided as an input (after possibly being summed with a fed-back value) to the next integrator 412-x+1 in the sequence. In one embodiment, the number of digital integrators 412 is five, although other embodiments are contemplated that include other pluralities of digital integrators 412 than five. Mux 411 receives a zero value on one of its inputs and receives a residue-based bleed term 482 from control logic 402 on its other input. Mux 411 is controlled by a control signal 483 provided by control logic 402. During normal operation, control signal 482 controls mux 411 to select the zero-valued input; however, in response to a request to transition the DCL_PWMM 24 (e.g., mute, power up/down, transition to another output path), the control logic 402 controls the mux 411 to select bleed term 482, as described in more detail below. Mux 416 receives on its two inputs a zero value and the output 408 of the quantizer 414. Mux 416 is controlled by a control signal 485 provided by control logic 402. During normal operation, mux 416 selects the output 408 of the quantizer 414; however, after bleeding a residue (described below) of the output of first integrator 412-0 in response to the transition request, the control logic 402 controls the mux 416 to select the zero-valued input to force the PWM encoder 418 to a 50% duty cycle, as described in more detail below. Control logic 402 receives the output 484-x of each of the integrators 412 which it uses to generate control signals 483/485 and to determine the value of bleed term 482. Advantageously, the bleed term 482 is used to bleed off a residue of the output value of first integrator 412-0, as described in more detail below. In a feedforward fashion, the output of mux 411 and each of the integrators 412 is summed and provided as the input to quantizer 414. The output of mux 416 is provided as the input to PWM encoder 418.

A feedback network includes a first summing element 413-0 that sums: (1) $V_{IN}$ of FIG. 3, (2) the output 408 of quantizer 414, and (3) the output of mux 411, and provides the sum as the input to the first integrator 412-0. In one embodiment, the summing element 413-0 negates the feedback value 408 of quantizer 414 and adds the negated value to the output of mux 411 and input signal $V_{IN}$ to generate the sum provided as the input to the first integrator 412-0. A second summing element 413-1 sums the output of the product of a gain element 415 and the output 484-0 of the first integrator 412-0 and provides its sum as the input to the second integrator 412-1. A third summing element 417 sums the output 404-1 of the second integrator 412-1 and a subsequent integrator 412-x (e.g., the third integrator 412-2 in the sequence) and provides the sum to gain element 415. Although an embodiment of a feedback/feedforward network for connecting the integrators 412 to form the digital modulator is described here, other embodiments are contemplated. That is, various topologies for connecting the integrators 412 to form a digital modulator may be employed including, but not limited to, cascaded-integrator feedback form (CIFB), cascaded-resonator feedback form (CRFB), cascaded-integrator feedforward form (CIFF), and cascaded-resonator feedback form (CRFF), as well as other combinations of other characteristics, such as delayed/non-delayed, and parallel rather than cascaded.

When the PWM encoder 418 receives an input value of zero (e.g., when mux 416 selects the zero-valued input or when the quantizer 414 is outputting a zero value), the PWM encoder 418 operates to output a 50% duty cycle. A ramp module (not shown) may be included to ensure that the input $V_{IN}$ to DCL_PWMM 24 goes to zero in response to a request to transition the DCL_PWMM 24. Once the input to input signal $V_{IN}$ reaches zero, the control logic 402 begins to bleed the residue portion of the first integrator 412-0 output in order to force the input to the PWM encoder 418 to zero, as described below.

An integrator is an infinite impulse response (IIR) filter modeled by a transfer function of $1/(1-z^{-1})$ such that the integrator outputs a running sum of its input values over time. The sequence of integrators 412, quantizer 414 and associated feedback and feedforward paths effectively operate as a digital signal modulator that produces a noise-shaped output of its input. However, because of a disparity between the resolution of the feedback value 408 provided by the quantizer 414 and the resolution of the output 484-0 of the first integrator 412-0—more specifically the output resolution is finer than the feedback resolution—it is difficult for the output 408 of quantizer 414 to track the input $V_{IN}$ when input $V_{IN}$ is zero, as will be described shortly, which may be a cause of audible pops/clicks during a transition of the amplifier. The distance between attainable values for feedback 408 is referred to as the feedback resolution. The distance between attainable values for output 484-0 of integrator 412-0 is referred to as the output resolution. For example, if the attainable values of the feedback 408 are $-224.0, -223.9, -223.8, \ldots, -0.1, 0.0, +0.1, \ldots, +223.8, +223.9, +224.0$, then the feedback resolution is 0.1. In one embodiment, the quantizer 414 outputs feedback values 408 that are integer values (e.g., values from −224 to +224), i.e., the feedback resolution is 1, and the values of output 484-0 of first integrator 412-0 have an output resolution of $2^{-8}$. However, other embodiments are contemplated with other feedback and output resolutions in which the feedback resolution is coarser than the output resolution.

Figure 9:
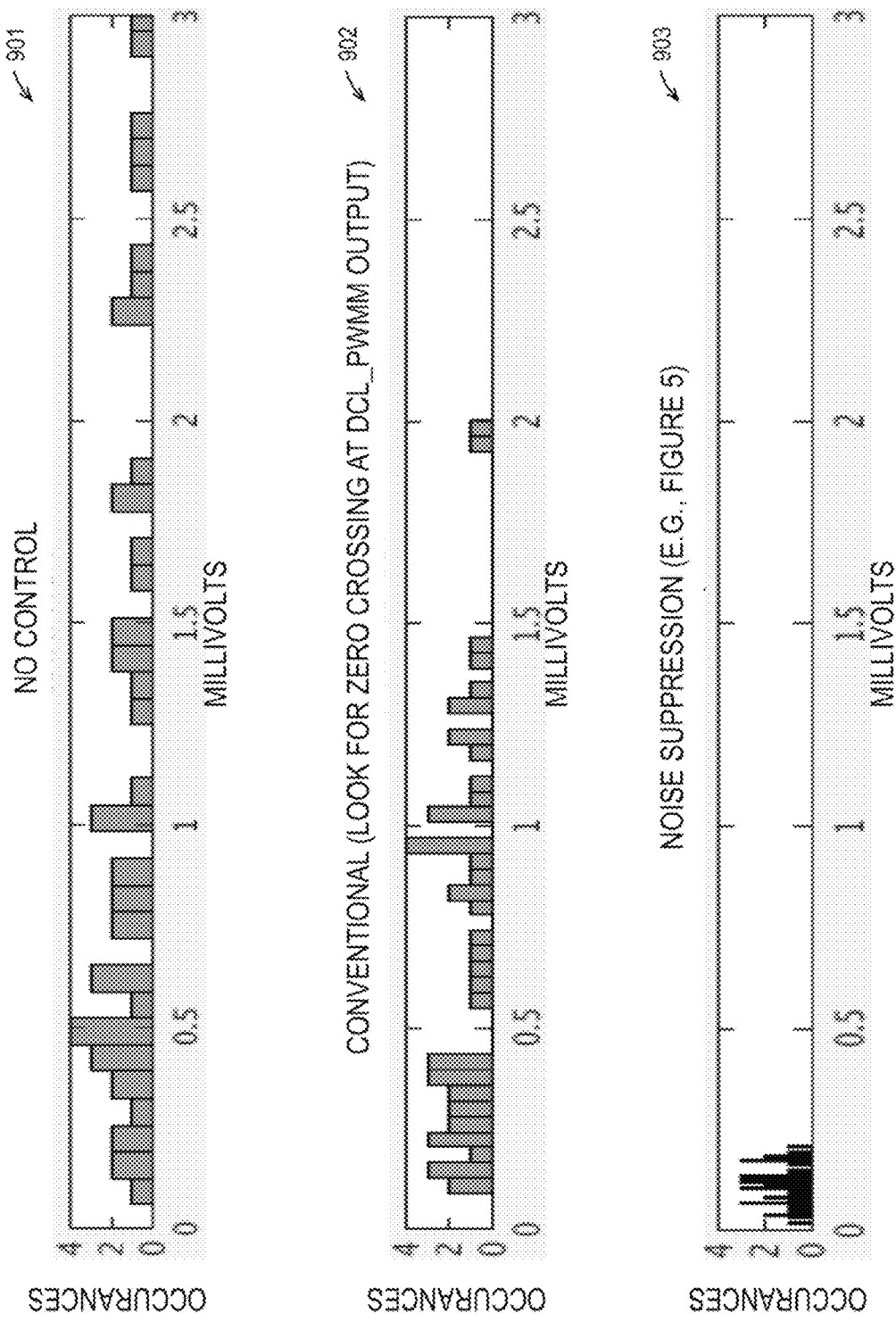
FIG. 9 is three histograms illustrating simulated results of application of embodiments of a transient noise suppression method (e.g., according to FIG. 5) during transition of a class-D amplifier having a DCL_PWMM.

As a result of the feedback resolution being coarser than the output resolution, the output value 484-0 of integrator 412-0 may be thought of as a sum of first and second portions, where the first portion is an integer multiple of the feedback resolution and the remaining/second portion is referred to as a residue. Stated alternatively, the residue may be thought of as a result of a modulo operation on the output value 484-0 with the modulus being the feedback resolution. Because the feedback resolution is coarser than the output resolution, the feedback 408 is unable to remove the residue from the output 484-0. In one embodiment, the first integrator 412-0 in the sequence of integrators 412 has the largest gain coefficient and the largest impact on the output value of the DCL_PWMM 24. It has been observed in simulations that if the residue is not removed from the first digital integrator 412-0, then the likelihood and magnitude of pops/clicks is much greater; whereas, it has been observed that substantially removing the residue from the first digital integrator 412-0 before forcing the PWM encoder 418 to a 50% duty cycle (e.g., with respect to FIGS. 5 through 7) advantageously may significantly reduce the likelihood and magnitude of pops/clicks (e.g., as illustrated in FIG. 9), as described in more detail below.

FIG. 5 is a flow diagram illustrating operation of the DCL_PWMM 24 of FIG. 4 in accordance with embodiments of the present disclosure. Flow begins at block 502.

At block 502, a request to transition the class-D amplifier 22 is detected. The request may be to power up one of the PWM output paths of the class-D amplifier 22, the request may be to mute or power down one or more of the PWM output paths of the class-D amplifier 22, or the request may be to switch from one of the PWM output paths to a different one of the PWM output paths. Flow proceeds to block 504.

At block 504, the input signal to the relevant DCL_PWMM 24 is ramped down to approximately zero in response to the transition request, e.g., by a ramp module of the class-D amplifier 22. Flow proceeds to block 506.

At block 506, after the input signal to the DCL_PWMM 24 is ramped down to approximately zero, the residue of the output 484-0 of the first integrator (e.g., integrator 412-0 of FIG. 4) of the DCL_PWMM 24 is decreased/increased toward an integer multiple of the feedback resolution over a sequence of clock cycles, e.g., by the control logic 402 of FIG. 4. Embodiments describing block 506 in more detail are described with respect to FIGS. 6 and 7 below. Flow proceeds to block 508.

At block 508, the output of the DCL_PWMM 24 is forced to have an approximate duty cycle of 50%. In one embodiment, the control logic 402 controls the output mux 416 to input a zero to the PWM encoder 418, which causes the PWM encoder 418 to operate to output a 50% duty cycle. Advantageously, as a result of this process transient artifacts output during the transition to the 50% duty cycle may be reduced, as illustrated in FIG. 9, which may result in a significant reduction of the likelihood and magnitude of audible pops/clicks. Flow ends at block 508.

FIG. 6 is a flow diagram illustrating operation of the DCL_PWMM 24 of FIG. 4 in accordance with embodiments of the present disclosure. More specifically, FIG. 6 illustrates in more detail the operation of block 506 of FIG. 5. Flow begins at block 602.

At block 602, the control logic 402 receives the output 484-0 of the first digital integrator 412-0 and determines the residue thereof. As described above, the feedback resolution is coarser than the output resolution, and the residue is a result of a modulo operation on the output value 484-0 with the modulus being the feedback resolution. Thus, the output value 484-0 of integrator 412-0 is a sum of an integer multiple of the feedback resolution and the residue. The control logic 402 then determines whether the residue is less than half the output resolution. If so, the control logic 402 computes the bleed term 482 as the quotient of the difference of zero minus the residue divided by a programmed number of clock cycles. Otherwise, the control logic 402 computes the bleed term 482 as the quotient of the difference of one minus the residue divided by the programmed number of clock cycles. In this manner, the control logic 402 effectively computes the distance from the residue to the nearest integer multiple of the feedback resolution and divides that value by the number of clock cycles. As may be observed, the bleed term 482 will be a negative value when the residue is less than one-half the output resolution and positive when the residue is greater than one-half the output resolution, which advantageously serves to move the residue in the direction of the nearest integer multiple of the feedback resolution. Picking a direction that minimizes the distance to move the residue reduces the maximum value of the bleed term 482 (e.g., by up to half). It is acceptable to decrease/increase the residue away from zero rather than toward zero because the feedback values 408 from the quantizer 414 will cancel out the portion of the output of first integrator 412-0 that is an integer multiple of the feedback resolution. Stated alternatively, because the feedback values 408 are integer multiples of the feedback resolution, they cannot remove a residue left in the first integrator 412-0. Advantageously, the small bleed term 482 does so by being added repeatedly over time (e.g., per blocks 604 or 704). Although an embodiment has been described in which the feedback values 408 are integer values, other embodiments are contemplated in which the quantizer 414 outputs non-integer values, and the control logic 402 computes a value for bleed term 482 that will steer the residue of the first integrator 412-0 toward an integer multiple of the feedback resolution. In the embodiment of FIG. 6, the bleed term 482 is computed using the single residue value at the beginning of the sequence of clock cycles and is thus computed as a static value that is used for each of the clock cycles in which it is added, thereby accomplishing an elimination of the residue in a linear fashion. FIG. 7 describes an alternate embodiment in which the bleed term 482 is computed as a dynamic value for each of the clock cycles in which it is added, thereby accomplishing an elimination of the residue in an exponential fashion. Flow proceeds to block 604.

At block 604, the summing element 413-0 adds the bleed term 482 (computed at block 602) to the feedback value 408 (and to the input value $V_{IN}$, which has been ramped to zero), and the sum is provided as the input to the first integrator 412-0. Flow proceeds to decision block 606.

At decision block 606, the control logic 402 determines whether the programmed number of clock cycles has been exhausted. If not, flow returns to block 604 to add the bleed term 482 during the next clock cycle; otherwise, flow ends. By repeatedly adding the bleed term 482 to the input of the DCL_PWMM 24, the residue is caused to decreased/increased toward the nearest multiple of the feedback resolution and effectively eliminated. For example, assume the feedback resolution is 1 and the output resolution is 0.25, and assume the programmed number of clock cycles is 128, and assume the output value 484-0 read at block 602 is 3.75. In this case, the residue is computed as 0.75 and the bleed term 482 as 0.25/128. Thus, in the succeeding clock cycles, the residue portion of the output value 484-0 will be increased as 0.75+(1*(0.25/128)), 0.75+(2*(0.25/128)), 0.75+(3*(0.25/128)), . . . , 0.75+(126*(0.25/128)), 0.75+(127*(0.25/128)), 0.75+(128*(0.25/128)), the last value being 1, which becomes part of the portion of the integrator output 484-0 that is an integer multiple of the feedback resolution, which may be eliminated by the feedback value 408 and thereby enable the output value 484-0 to become approximately zero and cause the DCL_PWMM 24 to aim at a true zero rather than at a non-zero residue value. In one embodiment, if the control logic 402 detects that the residue has crossed from one side of an integer multiple of the feedback resolution to the other in a sequence of two values of the output 484-0 of the first integrator 412-0, the control logic 402 controls input mux 411 to select the zero-valued input, rather than the bleed term 482, in order to stop incrementally adding the bleed term 482. Advantageously, the bleed term 482 is relatively small since it is a quotient whose divisor is the number of clock cycles. In one embodiment, there are four programmable lengths of clocks: 128, 256, 512, 1024. An advantage of using a relatively larger length of clocks is that the added bleed term 482 may be smaller, which may create less disturbance in the system and reduce the magnitude of any induced DC offset at the output of the DCL_PWMM 24. An advantage of using a relatively smaller length of clocks is that potentially the goal of effectively eliminating the residue may be reached faster, with the tradeoff that a larger bleed term 482 is being added.

FIG. 7 is a flow diagram illustrating operation of the DCL_PWMM 24 of FIG. 4 in accordance with embodiments of the present disclosure. More specifically, FIG. 7 illustrates in more detail the operation of block 506 of FIG. 5. The operation of FIG. 7 is similar in many respects to the operation of FIG. 6, except that the bleed term 482 is dynamically computed each clock cycle based on the current residue value, whereas the bleed term 482 is computed in a static manner in FIG. 6. Flow begins at block 702.

At block 702, the control logic 402 computes the bleed term 482 in a manner similar to that described above with respect to block 602 of FIG. 6. However, in the embodiment of FIG. 7, the bleed term 482 is computed not using the residue obtained at the beginning of the sequence of clock cycles as in FIG. 6; rather, the bleed term in FIG. 7 is computed using the residue obtained at each clock cycle of the sequence such that the bleed term 482 is a dynamic value that is used for each of the clock cycles in which it is added, thereby accomplishing an elimination of the residue in an exponential fashion. Flow proceeds to block 704.

At block 704, the summing element 413-0 adds the bleed term 482 (computed at block 702) to the feedback value 408 (and to the input value $V_{IN}$, which has been ramped to zero), and the sum is provided as the input to the first integrator 412-0. Flow proceeds to decision block 706.

At decision block 706, the control logic 402 determines whether the programmed number of clock cycles has been exhausted. If not, flow returns to block 702 to recompute the bleed term 482 before adding the bleed term 482 during the next clock cycle; otherwise, flow ends.

Generally speaking, the methods performed according to FIGS. 5 through 7 cause the DCL_PWMM 24, more specifically the output 408 of the quantizer 414, to seek zero rather than a value that is not an integer multiple of the quantizer 414, i.e., of the feedback resolution. More specifically, the method adds a small bleed term over a programmed length of time to the input of the DCL_PWMM 24 to precisely bleed the residue from the first digital integrator 412-0. Because the first digital integrator 412-0 has a relatively large effect on the DCL_PWMM 24, the bleeding of the residue from the first digital integrator 412-0 may influence the DCL_PWMM 24 to achieve outputting an approximately zero value rather than a value that is not an integer multiple of the feedback resolution by the time the PWM encoder is forced to a 50% duty cycle. This may be understood more clearly by a description of operation of an embodiment of the DCL_PWMM 24 without the benefit of the noise suppression method, e.g., without the repeated addition of the small bleed term 482 over the programmed length of clocks.

Because of the accumulated values within the digital integrators 412, the quantizer 414 will typically not output a zero value immediately after the input to the DCL_PWMM 24 is ramped down to zero. Rather, the nature of the DCL_PWMM 24 is to aim toward zero, but while doing so the DCL_PWMM 24 may generate significant amounts of quantization noise due to the accumulated values within the digital integrators 412. As described above, in one embodiment the value held in and output by, the first digital integrator 412-0 may have a residue, i.e., a portion that is not an integer multiple of the feedback resolution. For example, the output 484-0 may have a fractional (i.e., non-integer) component; whereas, the quantizer 414 may output integer values without a fractional component, which are fed-back to summing element 413-0, whose output is input to the first integrator 412-0. Typically, by the time the input $V_{IN}$ has been ramped down to zero, the quantizer 414 is outputting values of 0, +1 and −1 according to the operation of pulse width modulators. Thus, if the output of the input mux 411 is a true zero, the input to the first digital integrator 412-0 is purely an integer, i.e., it does not have a fractional component. Consequently, the quantizer 414 feedback value 408, which is an integer, is unable to remove the fractional residue of the first digital integrator 412-0 output value. For example, assume the residue of the first integrator 412-0 output 484-0 is 0.5. In this case, the next value (assuming the quantizer 414 is outputting either a zero, −1 or +1) output by the first integrator 412-0 will be −0.5, +0.5 or 1.5. And, this pattern will continue, since the resolution of the feedback 408 is an integer value, or more specifically, because the output 408 of the quantizer 414 is less precise than the output of the first integrator 412-0, i.e., the feedback resolution is coarser than the output resolution. The effective non-zero output of the first digital integrator 412-0 has the undesirable effect of continuously aiming the system at a non-zero value, rather than aiming at zero, which may result in a quantization noise-induced pop/click when the PWM encoder is forced to a 50% duty cycle. However, by advantageously repeatedly adding the small bleed term 482, the residue of the first integrator 412-0 is bled away relatively quickly, which aids the DCL_PWMM 24 in getting closer to a zero output before forcing the PWM encoder to a 50% duty cycle than it would without the bleeding of the residue, which may greatly reduce the likelihood of audible pops/clicks.

Figure 8:
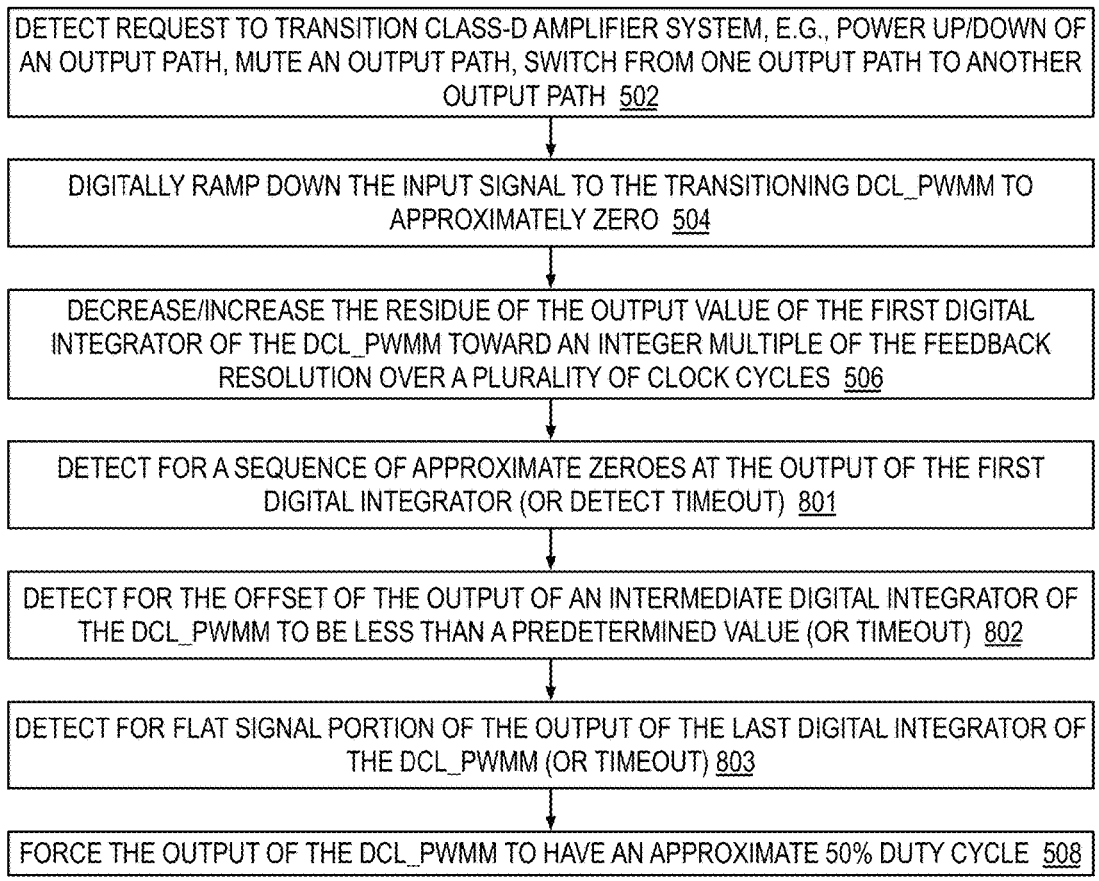

FIG. 8 is a flow diagram illustrating operation of the DCL_PWMM 24 of FIG. 4 in accordance with an alternate embodiment of the present disclosure. FIG. 8 is identical to FIG. 5, except that blocks 801, 802 and 803 are interposed between in the flow between blocks 506 and 508. At blocks 801, 802, and 803, additional conditions for forcing the DCL_PWMM output to have a 50% duty cycle are detected after decreasing/increasing the residue toward an integer multiple of the feedback resolution for multiple clock cycles. At block 801, the control logic 402 detects for a sequence of approximate zeroes at the output 484-0 of the first integrator 412-0. The sequence of approximate zeroes is a predetermined number of consecutively observed approximate zeroes at the first integrator 412-0 output 484-0. The predetermined number may be one or more. An approximate zero value is a relatively small voltage close to zero in which the absolute value is below a predetermined threshold. The predetermined threshold may be chosen based on factors such as a number of bits used to specify the bleed term 482 and/or a number of bits used to specify the first integrator 412-0 output value 484-0. For example, the lower N bits of the first integrator 412-0 output value 484-0 may be discarded in the approximate zero determination, where N may be a small number (e.g., two). At block 802, the control logic 402 detects for the absolute value of the output of an intermediate digital integrator of the sequence of digital integrators of the DCL_PWMM 24 to be below a predetermined value. In one embodiment, the predetermined value is 0.562 mV. In one embodiment, the intermediate digital integrator is the digital integrator having the second largest gain coefficient of the sequence of digital integrators (e.g., the second digital integrator 412-1 of FIG. 4). At block 803, the control logic 402 detects for a flat signal portion of the output of the last digital integrator (e.g., digital integrator 412-N of FIG. 4) of the sequence of digital integrators of the DCL_PWMM 24. The detection for the additional condition at block 803 may be helpful since the last digital integrator in the sequence is indicative of the current response of the DCL_PWMM and therefore finding a flat portion of the response may lead to smaller or inaudible pops/clicks. Once all of the conditions are detected, the DCL_PWMM 24 output is forced to the 50% duty cycle (at block 508). In other alternate embodiments, combinations of one, two or more of the different conditions are detected before the DCL_PWMM 24 output is forced to the 50% duty cycle. In one embodiment, the control logic 402 detects a timeout condition if the combination of conditions is not met with a predetermined number of clock cycles.

FIG. 9 is three histograms illustrating simulated results of application of embodiments of a transient noise suppression method (e.g., according to FIG. 5) during transition of a class-D amplifier 22 (e.g., having a DCL_PWMM of FIG. 4) in accordance with embodiments of the present disclosure. In each of the three histograms, the units along the horizontal axis are millivolts measured at the output of the DCL_PWMM 24 when its output is forced to a 50% duty cycle, and the units along the vertical axis are number of occurrences, or occurrence frequency, observed for the given number of millivolts measured at the output. The range of the output voltage is from zero to 3 millivolts. Generally speaking, in one example embodiment, the closer the output voltage is to 3 millivolts when the output is forced to a 50% duty cycle, the likelier and louder a pop or click will occur at the output. Hence, it is more desirable to cause as many occurrences of small voltage values (i.e., nearer to zero) as possible. As may be observed, approximately 50 observations were made and recorded for each of the three histograms.

In the first/top histogram 901, no attempt to quiet the output of the DCL_PWMM is made before forcing the 50% duty cycle. As may be observed, the output voltage value was between 2 and 3 millivolts for nine of the 50 observations, between 1 and 2 millivolts for fifteen of the 50 observations, and less than 1 millivolt for the remainder.

In the second/middle histogram 902, a conventional approach was made to observe a zero crossing of the DCL_PWMM output before forcing the 50% duty cycle. As may be observed, the output voltage value was between 2 and 3 millivolts for none of the 50 observations, between 1 and 2 millivolts for fifteen of the 50 observations, and less than 1 millivolt for the remainder.

In the third/bottom histogram 903, a noise suppression approach substantially as described with respect to the embodiment of FIG. 5 was made to quiet the output of the DCL_PWMM before forcing the 50% duty cycle, namely to move the residue in the output of the first integrator 412-0 of the DCL_PWMM 24 of FIG. 4 toward an integer multiple of the feedback resolution, which enables the feedback 408 to move the output 484-0 of the integrator 412-0 toward zero, which in turns aids the DCL_PWMM 24 to aim at a zero output. As may be observed, the output voltage value was between zero and 0.25 millivolts for all of the 50 observations. This may represent a significant improvement in reducing the likelihood of audible pops or clicks from the speaker.

Figure 10:
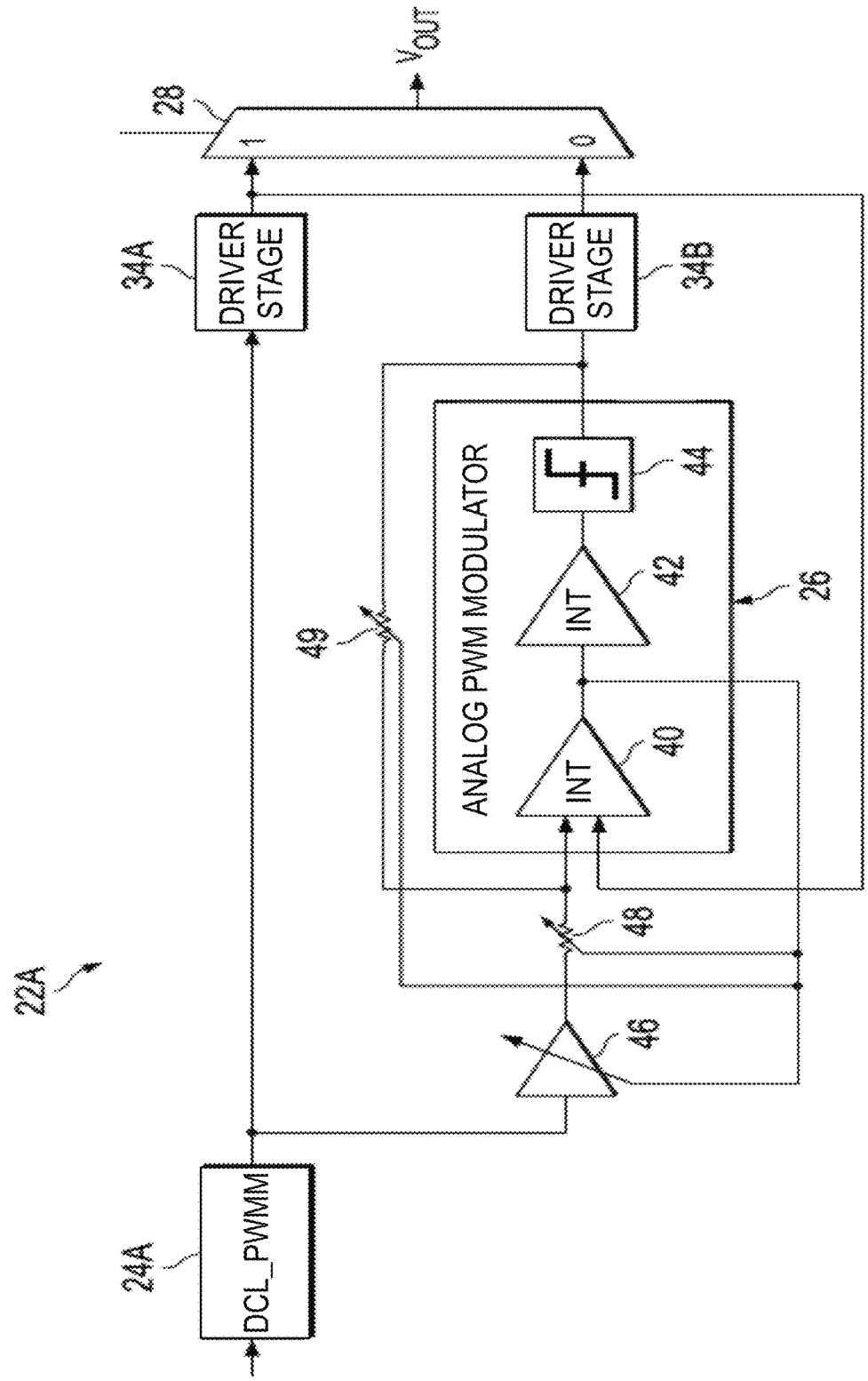
FIGS. 10 through 12 are block diagrams of selected components of an example class-D amplifier.

FIG. 10 is a block diagram of selected components of an example class-D amplifier 22A, in accordance with embodiments of the present disclosure. In some embodiments, class-D amplifier 22A may be used to implement class-D amplifier 22 of FIG. 3. As shown in FIG. 10, a single DCL_PWMM 24A may be used to implement DCL_PWMM 24, and analog PWM modulator 26 may include a first-stage integrator 40 followed by one or more additional stage integrators 42, which are in turn followed by a quantizer 44 that may generate an analog PWM signal to driver stage 34B. A buffer 46 may be interfaced between DCL_PWMM 24A and analog PWM modulator 26 to buffer a digital PWM signal generated by DCL_PWMM 24A to the input of analog PWM modulator 26. Gain resistors 48 and 49 may also be present to define a gain of analog PWM modulator 26.

As shown in FIG. 10, the gain of buffer 46, gain resistor 48, and/or gain resistor 49 may be variable. When calibration is enabled, first-stage integrator 40 of analog PWM modulator 26 may be re-used as a filter and comparator combination for detecting a gain of the open-loop path including driver stage 34A. Because one input to the comparator implemented using first-stage integrator 40 is the digital signal generated by DCL_PWMM 24A (or in alternative embodiments, the input signal to DCL_PWMM 24A) and the other input to the comparator implemented using first-stage integrator 40 is the output of driver stage 34A, the output of first-stage integrator 40, when calibration is enabled, is indicative of the gain of the open-loop path. Such detected gain may then be used to appropriately set a gain of buffer 46, a resistance of gain resistor 48, and/or a resistance of gain resistor 49, so as to match the gain of the closed-loop path including analog PWM modulator 26 to the gain of the open-loop path.

Figure 11:
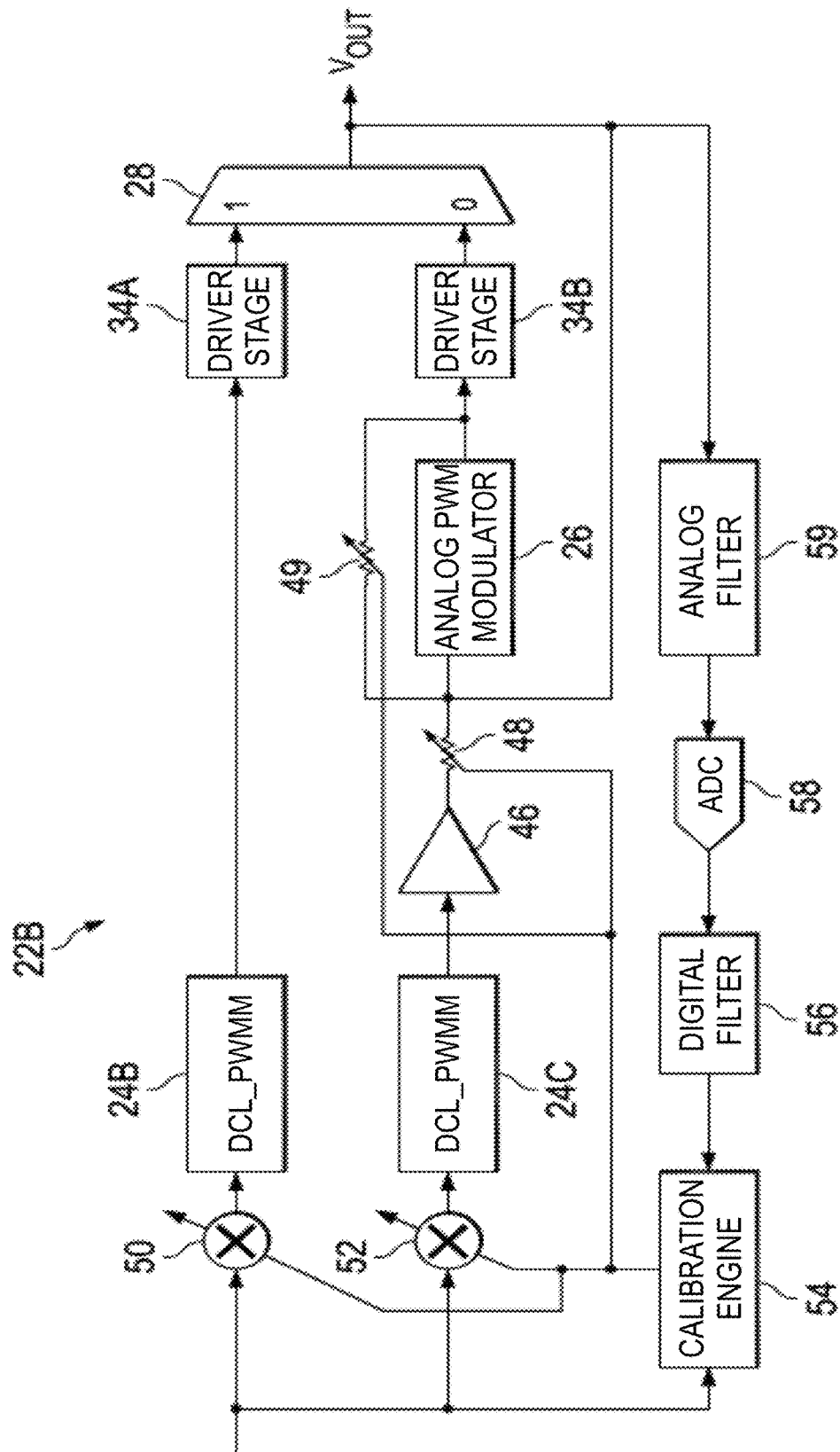

FIG. 11 is a block diagram of selected components of an example class-D amplifier 22B, in accordance with embodiments of the present disclosure. In some embodiments, class-D amplifier 22B may be used to implement class-D amplifier 22 of FIG. 3. As shown in FIG. 11, DCL_PWMM 24 of FIG. 2 may be implemented using a first DCL_PWMM 24B and a second DCL_PWMM 24C. DCL_PWMM 24B may drive open-loop driver stage 34A while DCL_PWMM 24C may drive analog PWM modulator 26 via a buffer 46 configured to buffer a digital PWM signal generated by DCL_PWMM 24C to the input of analog PWM modulator 26. Gain resistors 48 and 49 may also be present to define a gain of analog PWM modulator 26.

As also shown in FIG. 11, a gain element 50 may interface between the input to class-D amplifier 22B and DCL_PWMM 24B and a gain element 52 may interface between the input to class-D amplifier 22B and DCL_PWMM 24C. Gain element 50 may apply a coarse gain setting to the open-loop path while gain element 52 may apply a smaller fine gain setting to the closed-loop path. A calibration engine 54 may detect output signal $V_{OUT}$ as filtered by an analog filter 59, converted from the analog domain to the digital domain by ADC 58, and filtered by digital filter 56. Such filtering may ensure that calibration is performed based only upon in-band signal content. Calibration engine 54 may also sense the input signal to allow it to compare the input signal to the digital domain representation of output signal $V_{OUT}$ in order to determine a gain of the open-loop path. Although not shown, digital filtering similar to that of output signal $V_{OUT}$ may be performed on the input signal prior to receipt by calibration engine 54, and the input signal and output signal $V_{OUT}$ may also be delay matched to properly measure gain. Based on the determined gain, calibration engine 54 may calibrate gain element 50 and/or gain element 52 in the digital domain prior to digital modulation such that the open-loop path and closed-loop path have the same path gain. In some embodiments, calibration engine 54 may also be able to vary a resistance of gain resistor 48 and/or a resistance of gain resistor 49 in order to calibrate gains of the open-loop path and the closed-loop path.

In operation, the calibration system shown in FIG. 11 may calibrate on actual playback content represented by the input signal or based on an inaudible pilot tone which may be used only for calibration.

Figure 12:
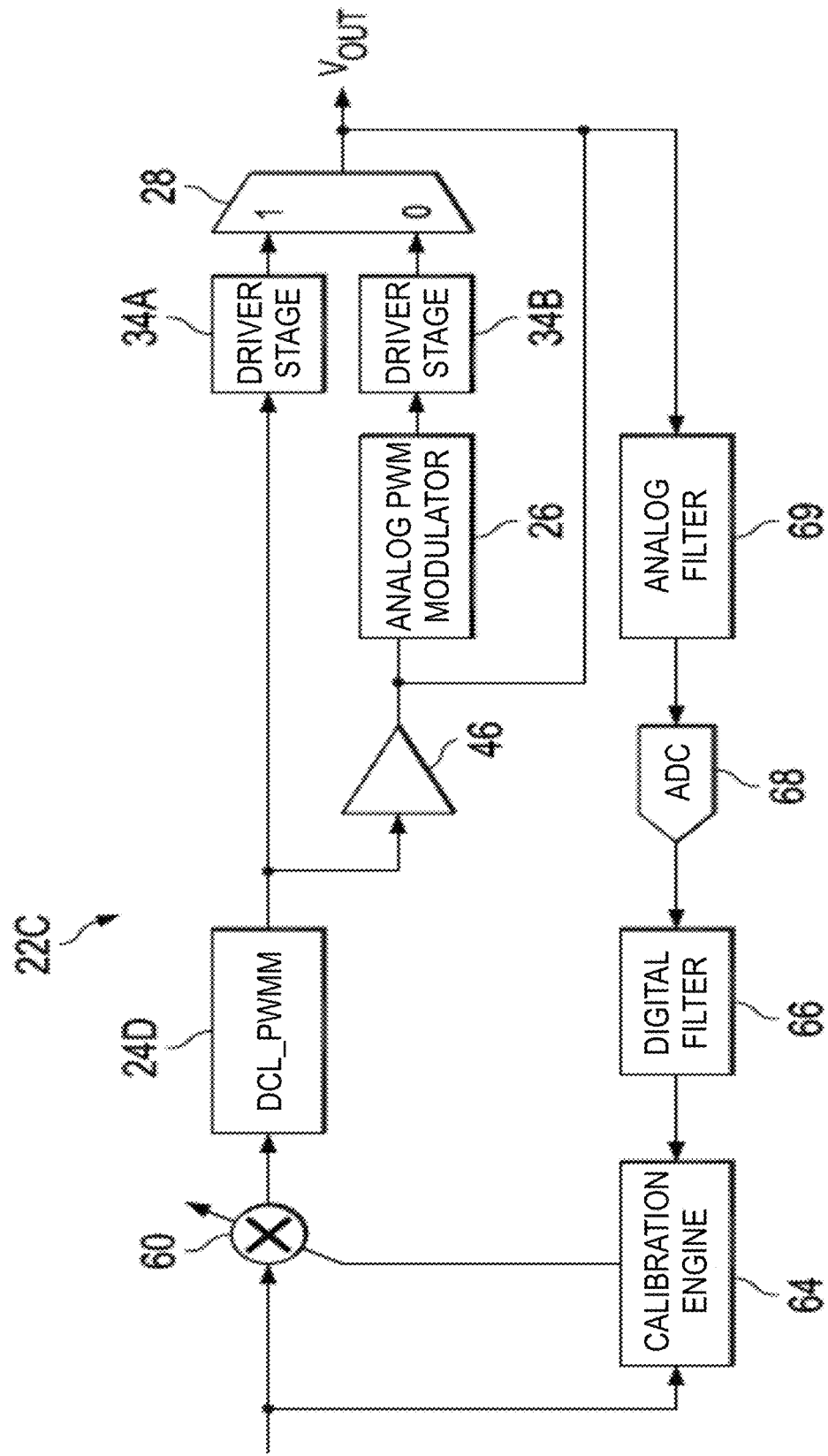

FIG. 12 is a block diagram of selected components of an example class-D amplifier 22C, in accordance with embodiments of the present disclosure. In some embodiments, class-D amplifier 22C may be used to implement class-D amplifier 22 of FIG. 3. As shown in FIG. 12, digital PWM modulation subsystem 24 of FIG. 2 may be implemented using a single DCL_PWMM 24D. Digital PWM modulator 24D may drive open-loop driver stage 34A while DCL_PWMM 24D may drive analog PWM modulator 26 via a buffer 46 configured to buffer a digital PWM signal generated by DCL_PWMM 24C to the input of analog PWM modulator 26.

As also shown in FIG. 12, a gain element 60 may interface between the input to class-D amplifier 22C and DCL_PWMM 24D. Gain element 60 may apply a variable gain to the input signal before modulation by class-D amplifier 22C. A calibration engine 64 may detect output signal $V_{OUT}$ as filtered by an analog filter 69, converted from the analog domain to the digital domain by ADC 68, and filtered by digital filter 66. Such filtering may ensure that calibration is performed based only upon in-band signal content. Calibration engine 64 may also sense the input signal to allow it to compare the input signal to the digital domain representation of output signal $V_{OUT}$ in order to determine a gain of the open-loop path. Although not shown, digital filtering similar to that of output signal $V_{OUT}$ may be performed on the input signal prior to receipt by calibration engine 64, and the input signal and output signal $V_{OUT}$ may also be delay matched to properly measure gain. Based on the determined gain, calibration engine 64 may calibrate gain element 60 in the digital domain prior to digital modulation such that the open-loop path and closed-loop path have the same path gain.

The gain calibration may ensure that a first gain of the open-loop path and a second gain of the closed-loop path are approximately equal at the time of switching selection between the open-loop path and the closed-loop path or vice versa, in order to reduce artifacts due to the switching. The gain calibration may be employed in conjunction with the transient noise suppression during transition of the class-D amplifier as described herein, e.g., in a DCL_PWMM of FIG. 4 according to the methods of FIGS. 5 through 8.

Although described in the context of a class-D amplifier, the quantization noise suppression embodiments may aid in a transition of other digital closed loop delta-sigma-type modulators. Additionally, the embodiments may be employed to quiet the digital pulse width modulator when starting back up, e.g., resuming from a mute state while the digital modulator was still running. The embodiments described above may ensure that the digital modulator is starting in a quiet state, rather than a noisy state.

Embodiments are described that manipulate a DCL_PWMM of a class-D amplifier and find a quiet time to force the modulator quantization noise to zero without introducing a pop in the process. Previous solutions disable the output after ramping down the digital signal input to the digital modulator. This leads to very large pops and clicks because a quiet spot in the digital modulator has not been determined to force the output signal to zero to reduce the quantization noise. Advantageously, embodiments described may allow a smooth transition to the 50% duty cycle without introducing an audible pop by the speaker driven by the output path that includes the DCL_PWMM.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. A class-D amplifier system, comprising:
   one or more pulse width modulation (PWM) output paths at least one of which comprising one or more digital closed-loop PWM modulators (DCL-PWMM);
   wherein at least one of the DCL_PWMM includes a digital integrator that provides an output value and receives a feedback value, the output value having an output resolution and the feedback value having a feedback resolution, the output resolution being finer than the feedback resolution;
   wherein the output value is the sum of an integer multiple of the feedback resolution and a residue; and
   control logic configured to:
      decrease/increase the residue of the digital integrator toward an integer multiple of the feedback resolution over a plurality of clock cycles in response to a request to transition the class-D amplifier; and
      force an output of the DCL_PWMM to have an approximate 50% duty cycle after decreasing/increasing the residue over the plurality of clock cycles.

2. The class-D amplifier system of claim 1, wherein the transition is one or more of the following: power up/down of the one or more PWM output paths, mute of the one or more PWM output paths, and a switching transition from one of the one or more PWM output paths to another of the one or more PWM output paths.

3. The class-D amplifier system of claim 1,
   wherein the control logic is further configured to digitally ramp down an input to the DCL-PWMM to approximately zero before beginning to decrease/increase the residue.

4. The class-D amplifier system of claim 1,
   wherein to decrease/increase the residue, the control logic adds a bleed term to the feedback value over the plurality of clock cycles.

5. The class-D amplifier system of claim 4,
   wherein the bleed term is computed using the residue and the plurality of clock cycles.

6. The class-D amplifier system of claim 4,
   wherein the residue is decreased/increased over the plurality of clock cycles in a direction toward the nearest integer multiple of the feedback resolution.

7. The class-D amplifier system of claim 4,
   wherein the bleed term is computed as a static value at an initial clock cycle of the plurality of clock cycles, and the static value is added in each clock cycle of the plurality of clock cycles.

8. The class-D amplifier system of claim 4,
   wherein, for each clock cycle of the plurality of clock cycles, the bleed term is computed as a dynamic value using the residue at the previous clock cycle.

9. The class-D amplifier system of claim 1,
   wherein the plurality of clock cycles is programmed.

10. The class-D amplifier system of claim 1,
    wherein the control logic is configured to force the output of the DCL_PWMM to have an approximate 50% duty cycle after observing a sequence of approximate zero values of the residue.

11. The class-D amplifier system of claim 1,
    wherein the digital integrator in which the residue is decreased/increased is a first digital integrator in a sequence of digital integrators of the DCL_PWMM; and
    wherein the control logic is configured to force the output of the DCL_PWMM to have an approximate 50% duty cycle after decreasing/increasing the residue over the plurality of clock cycles and also after detecting a flat signal portion of an output of a second digital integrator of the DCL-PWMM, where the second digital integrator is a last digital integrator in the sequence of digital integrators.

12. The class-D amplifier system of claim 1,
wherein the digital integrator in which the residue is decreased/increased is a first digital integrator in a sequence of digital integrators of the DCL_PWMM; and
wherein the control logic is configured to force the output of the DCL_PWMM to have an approximate 50% duty cycle after decreasing/increasing the residue over the plurality of clock cycles and also after detecting a magnitude of a residue of a second digital integrator of the DCL-PWMM is less than a predetermined value, wherein the second digital integrator is subsequent to the first digital integrator in the sequence of digital integrators.

13. A method of suppressing transient noise during transition of a class-D amplifier system having one or more pulse width modulation (PWM) output paths at least one of which comprising one or more digital closed-loop PWM modulators (DCL-PWMM), wherein at least one of the DCL_PWMM includes a digital integrator that provides an output value and receives a feedback value, the output value having an output resolution and the feedback value having a feedback resolution, the output resolution being finer than the feedback resolution, wherein the output value is the sum of an integer multiple of the feedback resolution and a residue, the method comprising:
for at least one of the one or more DCL-PWMM:
decreasing/increasing the residue of the digital integrator toward an integer multiple of the feedback resolution over a plurality of clock cycles in response to a request to transition the class-D amplifier; and
forcing an output of the DCL_PWMM to have an approximate 50% duty cycle after decreasing/increasing the residue over the plurality of clock cycles.

14. The method of claim 13, wherein the transition is one or more of the following: power up/down of the one or more PWM output paths, mute of the one or more PWM output paths, and a switching transition from one of the one or more PWM output paths to another of the one or more PWM output paths.

15. The method of claim 13, further comprising:
digitally ramping down an input to the DCL-PWMM to approximately zero before beginning to decrease/increase the residue.

16. The method of claim 13,
wherein said decreasing/increasing the residue comprises adding a bleed term to the feedback value over the plurality of clock cycles.

17. The method of claim 16, further comprising:
computing the bleed term using the residue and the plurality of clock cycles.

18. The method of claim 16,
wherein the residue is decreased/increased over the plurality of clock cycles in a direction toward the nearest integer multiple of the feedback resolution.

19. The method of claim 16, further comprising:
computing the bleed term as a static value at an initial clock cycle of the plurality of clock cycles, wherein the static value is added in each clock cycle of the plurality of clock cycles.

20. The method of claim 16, further comprising:
for each clock cycle of the plurality of clock cycles, computing the bleed term as a dynamic value using the residue at the previous clock cycle.

21. The method of claim 13,
wherein the plurality of clock cycles is programmed.

22. The method of claim 13,
wherein said forcing the output of the DCL_PWMM to have an approximate 50% duty cycle is performed after observing a sequence of approximate zero values of the residue.

23. The method of claim 13,
wherein the digital integrator in which the residue is decreased/increased is a first digital integrator in a sequence of digital integrators of the DCL_PWMM; and
wherein said forcing the output of the DCL_PWMM to have an approximate 50% duty cycle is performed after decreasing/increasing the residue over the plurality of clock cycles and also after detecting a flat signal portion of an output of a second digital integrator of the DCL-PWMM, where the second digital integrator is a last digital integrator in the sequence of digital integrators.

24. The method of claim 13,
wherein the digital integrator in which the residue is decreased/increased is a first digital integrator in a sequence of digital integrators of the DCL_PWMM; and
wherein said forcing the output of the DCL_PWMM to have an approximate 50% duty cycle is performed after decreasing/increasing the residue over the plurality of clock cycles and also after detecting a magnitude of a residue of a second digital integrator of the DCL-PWMM is less than a predetermined value, wherein the second digital integrator is subsequent to the first digital integrator in the sequence of digital integrators.

* * * * *